United States Patent
Choi et al.

(10) Patent No.: US 9,172,004 B2
(45) Date of Patent: Oct. 27, 2015

(54) LIGHT EMITTING DEVICE PACKAGE

(71) Applicant: LG INNOTEK CO., LTD., Seoul (KR)

(72) Inventors: Byeong Kyun Choi, Seoul (KR); Jae Won Seo, Seoul (KR); Sung Ho Choo, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 14/267,358

(22) Filed: May 1, 2014

(65) Prior Publication Data

US 2014/0332839 A1    Nov. 13, 2014

(30) Foreign Application Priority Data

May 7, 2013  (KR) .................. 10-2013-0051082

(51) Int. Cl.
| | |
|---|---|
| H01L 33/62 | (2010.01) |
| H01L 33/38 | (2010.01) |
| H01L 33/48 | (2010.01) |
| H01L 23/00 | (2006.01) |
| H01L 33/64 | (2010.01) |

(52) U.S. Cl.
CPC ............. H01L 33/387 (2013.01); H01L 24/14 (2013.01); H01L 24/17 (2013.01); H01L 33/486 (2013.01); H01L 33/62 (2013.01); H01L 33/64 (2013.01); H01L 2224/16245 (2013.01)

(58) Field of Classification Search
None
See application file for complete search history.

(56) References Cited

U.S. PATENT DOCUMENTS

| | | | |
|---|---|---|---|
| 2009/0179207 A1* | 7/2009 | Chitnis et al. | 257/88 |
| 2009/0200570 A1* | 8/2009 | Mori et al. | 257/99 |
| 2010/0019247 A1* | 1/2010 | Joichi et al. | 257/76 |
| 2010/0051324 A1* | 3/2010 | Lee et al. | 174/251 |
| 2011/0147779 A1 | 6/2011 | Kang et al. | 257/98 |
| 2011/0155433 A1 | 6/2011 | Funaya et al. | 174/258 |
| 2013/0213697 A1* | 8/2013 | Palaniswamy et al. | 174/254 |
| 2014/0319564 A1* | 10/2014 | Lin et al. | 257/98 |

FOREIGN PATENT DOCUMENTS

| | | | | |
|---|---|---|---|---|
| EP | 0 854 520 A2 | 7/1998 | | |
| EP | 1 821 345 A1 | 8/2007 | | |
| WO | WO 2007001995 A1 | * 1/2007 | ............... | H05K 1/00 |
| WO | WO 2012/061182 A1 | 5/2012 | | |
| WO | WO 2012061182 | * 5/2012 | ............... | H05K 1/18 |
| WO | WO 2013/040652 A1 | 3/2013 | | |

OTHER PUBLICATIONS

European Search Report dated Oct. 23, 2014 issued in Application No. 14 166 559.6.

* cited by examiner

*Primary Examiner* — Joseph Schoenholtz
(74) *Attorney, Agent, or Firm* — Ked & Associates, LLP

(57) ABSTRACT

A light emitting device package includes a body having a cavity therein and first and second recesses inside the cavity of the body. The first and second electrode layers are provided in the first and second recesses, and a light emitting device is provided on the first and second electrode layers. The first and second bumps are provided under the light emitting device and attached to the first and second recesses.

20 Claims, 11 Drawing Sheets

LIGHT EMITTING DEVICE PACKAGE

CROSS-REFERENCE TO RELATED APPLICATION

This application claims priority under 35 U.S.C. §119 to Korean Patent Application No. 10-2013-0051082 filed on May 7, 2013, whose entire disclosure is hereby incorporated by reference.

BACKGROUND

1. Field

The embodiment relates to a light emitting device package.

2. Background

Studies and researches on a light emitting device and a light emitting device package have been actively carried out. The light emitting device is a semiconductor light emitting device or a semiconductor light emitting diode formed of a semiconductor material to convert electrical energy into light.

In comparison with other light sources such as a fluorescent lamp and an incandescent lamp, the LED is advantageous because of low power consumption, a long lifetime, a fast response time, safety, and environment-friendliness. Accordingly, many studies and researches to substitute the existing light sources with the light emitting diode have been performed.

In addition, light emitting devices are increasingly used as light sources of a variety of lamps used in indoor and outdoor places, a backlight unit of a liquid crystal display, a display device such as an electronic display board, and a lighting device such as a streetlamp.

BRIEF DESCRIPTION OF THE DRAWINGS

The embodiments will be described in detail with reference to the following drawings in which like reference numerals refer to like elements wherein.

DETAILED DESCRIPTION

In the description of embodiments, it will be understood that when a layer (or film) is referred to as being 'on' another layer or substrate, it can be directly on another layer or substrate, or intervening layers may also be present. Further, it will be understood that when a layer is referred to as being 'under' another layer, it can be directly under another layer, and one or more intervening layers may also be present. In addition, it will also be understood that when a layer is referred to as being 'between' two layers, it can be the only layer between the two layers, or one or more intervening layers may also be present.

Figure 1:
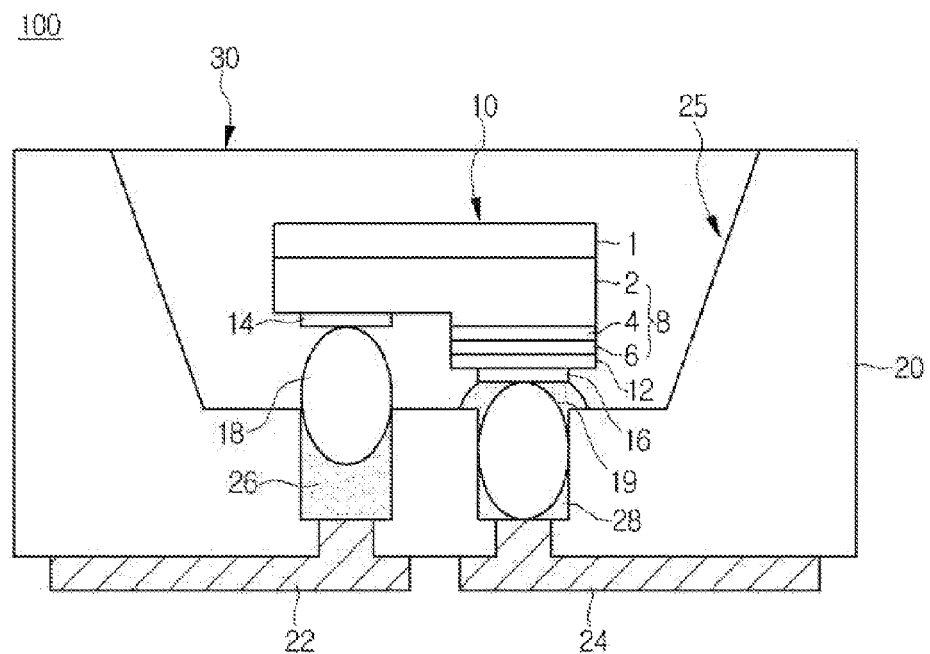
FIG. 1 is a sectional view showing a light emitting device package according to a first embodiment.

Referring to FIG. 1, the light emitting device package according to the first embodiment may include a body 20, first and second electrode layers 22 and 24, a light emitting device 10, and a molding member 30. The body 20 may support the light emitting device 10, and may be electrically connected with the light emitting device 10. To this end, the first and second electrode layers 22 and 24 may be formed on the body 20.

The body 20 may include a material representing superior support strength and superior heat radiation performance, but the embodiment is not limited thereto. For example, the body 20 may include a silicon material, a synthetic resin material, a ceramic material, or a metallic material. The body 20 may be formed in an upper region thereof with a cavity 25 having an inclined surface and recessed downward, but the embodiment is not limited thereto. In other words, the cavity 25 may include the inclined surface and a flat bottom surface, but the embodiment is not limited thereto.

The first and second electrode layers 22 and 24 may be electrically insulated from each other and spaced apart from each other. The first and second electrode layers 22 and 24 may be formed through the body 20. In other words, the first and second electrode layers 22 and 24 may be formed on a bottom surface of the body 20 while being vertically formed through the body 20. In addition, the first and second electrode layers 22 and 24 may be formed on lateral sides of the body 20 while being horizontally formed through the body 20.

The first and second electrode layers 22 and 24 according to the first embodiment have the above-described configuration, but the embodiment is not limited thereto. The first and second electrode layers 22 and 24 may include a metallic material, such as copper (Cu), aluminum (Al), chrome (Cr), platinum (Pt), nickel (Ni), titanium (Ti), gold (Au), or W (tungsten), representing superior electric conductivity and superior corrosion resistance, but the embodiment is not limited thereto.

A material constituting the body 20 is injected through an injection molding process in the state that the first and second electrodes layers 22 and 24 are provided, and hardened to form the body 20, so that the first and second electrode layers 22 and 24 may fix the body 20, but the embodiment is not limited thereto. The first and second electrode layers 22 and 24 may include a single layer or a multi-layer, but the embodiment is not limited thereto.

Figure 3:
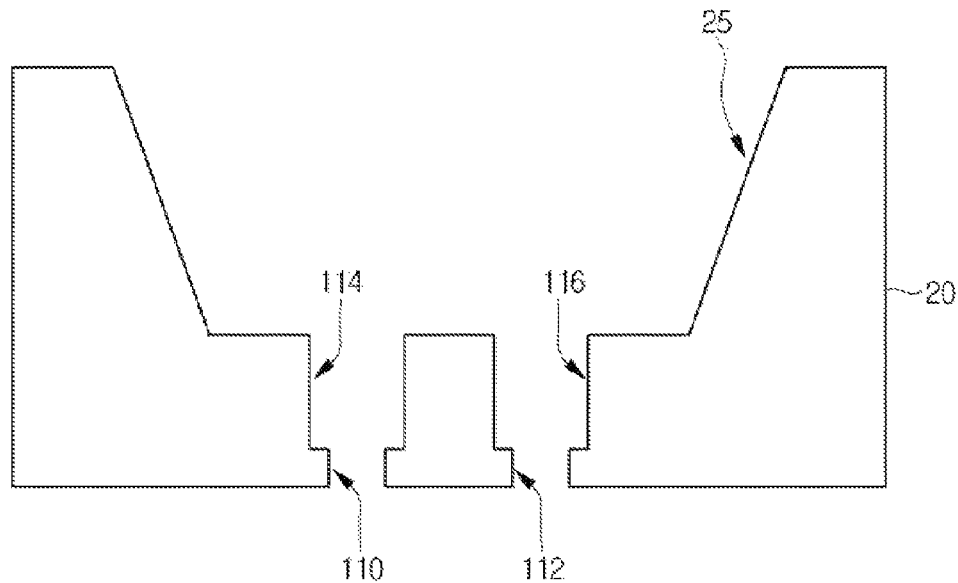
FIG. 3 is a sectional view showing a body of FIG. 1.

As shown in FIG. 3, the body 20 may include the upper region having first and second recesses 114 and 116 and a lower region having first and second holes 110 and 112 spatially connected with the first and second recesses 114 and 116. The first and second recesses 114 and 116 may be recessed downward from the bottom surface of the cavity 25, but the embodiment is not limited thereto.

The first and second recesses 114 and 116 may have a rectangular shape when viewed in a side view, but the embodiment is not limited thereto. In other words, the first and second recesses 114 and 116 may have a cylindrical shape or a concave-convex shape. The first and second recesses 114 and 116 may fix the light emitting device 10, but the embodiment is not limited thereto.

The first hole 110 may be formed from the first recess 114 to the bottom surface of the body 20 through the body 20, and the second hole 112 may be formed from the second recess 116 to the bottom surface of the body 20 through the body 20. The diameter of the first recess 114 may be greater than that of the first hole 110, but the embodiment is not limited thereto. The diameter of the second recess 116 may be greater than that of the second hole 112, but the embodiment is not limited thereto.

Figure 4:
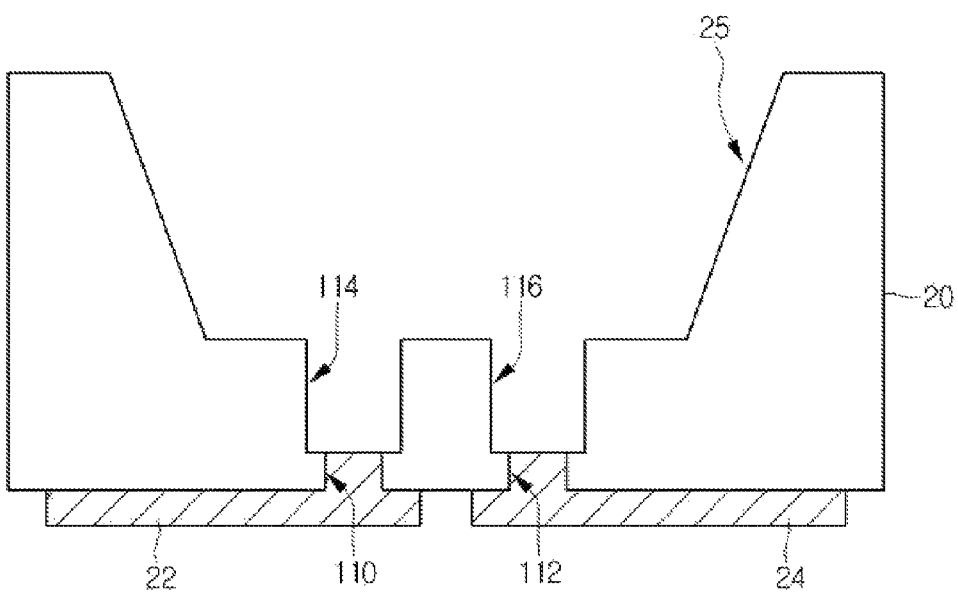
FIG. 4 is a sectional view showing a body having an electrode layer of FIG. 1.

As shown in FIG. 4, the first electrode layer 22 may be formed in the first hole 110, and the second electrode layer 24 may be formed in the second hole 112, but the embodiment is not limited thereto.

The first electrode layer 22 may be formed in the first hole 110 in such a manner that the first electrode layer 22 is exposed by the first recess 114, and may be formed in a first region of the bottom surface of the body 20, but the embodiment is not limited thereto. The second electrode layer 24 may be formed in the second hole 112 in such a manner that the second electrode layer 24 is exposed by the second recess 116, and may be formed in a second region of the bottom surface of the body 20, but the embodiment is not limited thereto.

A first protrusion part protruding from the first electrode layer 22 in the first hole 110 and a second protrusion part protruding from the second electrode layer 24 in the second hole 112 may be additionally provided, but the embodiment is not limited thereto. The first and second protrusion parts may have outer peripheral portions surrounded by the body 20.

The diameter of each of the first and second recesses 114 and 116 may be equal to or greater than the width of each of the first and second electrode layers 22 and 24 passing through the body 20, but the embodiment is not limited thereto. The first and second recesses 114 and 116 may have the same shape, that is, the same depth or the same diameter, but the embodiment is not limited thereto.

The first and second recesses 114 and 116 may be filled with solder pastes 26 and 28. The solder pastes 26 and 28 may fix the first and second electrode layers 22 and 24 to the light emitting device 10. Therefore, since the diameter of each of the first and second recesses 114 and 116 is greater than the width of each of the first and second electrode layers 22 and 24, the contact areas between the solder pastes 26 and 28 in the first and second recesses 114 and 116 and the first and second electrode layers 22 and 24 are maximized, so that the light emitting device 10 may be more strongly fixed to the body 20.

Figure 2:
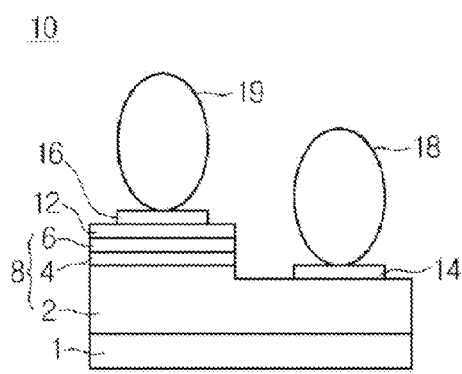
FIG. 2 is a sectional view showing the light emitting device of FIG. 1.

As shown in FIG. 2, the light emitting device 10 may be a flip-chip type light emitting device, but the embodiment is not limited thereto. The light emitting device 10 may include a growth substrate 1, a light emitting structure 8, and first and second electrodes 14 and 16.

The growth substrate 1 is used to grow the light emitting structure 8 while supporting the light emitting structure 8. The growth substrate 1 may include a material appropriate for the growth of the light emitting 8. The growth substrate 1 may include a material having a thermal stability and a lattice constant approximate to that of the light emitting structure 8. The growth substrate 1 may include one of a conductive substrate, a compound semiconductor substrate, and an insulating substrate, but the embodiment is not limited thereto.

The growth substrate 1 may include at least one selected from the group consisting of sapphire (Al2O3), SiC, Si, GaAs, GaN, ZnO, GaP, InP and Ge. The growth substrate 1 may include dopants to have conductivity, but the embodiment is not limited thereto. The growth substrate 1 including the dopants may serve as an electrode layer, but the embodiment is not limited thereto.

Although not shown, the light emitting device 10 may further a buffer layer (not shown) between the growth substrate 1 and the light emitting structure 8. The buffer layer may reduce the difference in lattice constant between the growth substrate 1 and the light emitting structure 8. In addition, the buffer layer may prevent the material constituting the growth substrate 1 from being diffused to the light emitting structure 8, prevent a melt-back phenomenon such as a recess formed in the top surface of the growth substrate 1, or prevent the growth substrate 1 from being broken by controlling stress, but the embodiment is not limited thereto.

The light emitting structure 8 may include a plurality of compound semiconductor layers. The light emitting 8 may include a first conductive semiconductor layer 2, an active layer 4, and a second conductive semiconductor layer 6, but the embodiment is not limited thereto.

The buffer layer, the first conductive semiconductor layer 2, the active layer 4, and the second conductive semiconductor layer 6 may include group II-VI compound semiconductor materials or group III-V compound semiconductor materials, that is, $Al_xIn_yGa(1-x-y)N(0<x<1, 0<y<1, and 0<x+y<1)$. For example, the buffer layer, the first conductive semiconductor layer 2, the active layer 4, and the second conductive semiconductor layer 6 may include at least one selected from the group consisting of InAlGaN, GaN, AlGaN, InGaN, AlN, InN and AlInN, but the embodiment is not limited thereto.

The first conductive semiconductor layer 2 may include an N-type semiconductor layer doped with N-type dopants, and the second conductive semiconductor layer 6 may include a P-type semiconductor layer doped with P-type dopants. The N-type dopant includes at least one of Si, Ge, Sn, Se and Te, and the P-type dopant includes at least one of Mg, Zn, Ca, Sr, and Ba, but the embodiment is not limited thereto. The first conductive semiconductor layer 2 may generate first carriers, that is, electrons, and the second conductive semiconductor layer 6 may generate second carriers, that is, holes, but the embodiment is not limited thereto.

The active layer 4 is interposed between the first and second conductive semiconductor layers 2 and 6 to emit light having a wavelength corresponding to the energy band gap difference according to materials constituting the active layer 4 through the recombination of electrons from the first conductive semiconductor layer 2 and holes from the second conductive semiconductor layer 6.

The active layer 4 may have one of a multi-quantum well (MQW) structure, a quantum dot structure, and a quantum wire structure. The active layer 4 may have well layers and barrier layers repeatedly formed at one cycle of a well layer and a barrier layer. The repetition cycle of a well layer and a barrier layer may be varied depending on the characteristic of the light emitting device 10, but the embodiment is not limited thereto.

For example, the active layer 4 may be formed at a cycle of InGaN/GaN, a cycle of InGaN/AlGaN or a cycle of InGaN/InGaN. The bandgap of the barrier layer may be greater than that of the well layer.

The light emitting device 10 may further include a reflective electrode layer 12 above the second conductive semiconductor layer 6, that is, between the second conductive semiconductor layer 6 and the second electrode 16, but the embodiment is not limited thereto.

The reflective electrode layer 12 reflects light generated from the active layer 4 while making ohmic contact with the second conductive semiconductor layer 6, so that power can be more smoothly supplied, but the embodiment is not limited thereto. The reflective electrode layer 12 may include a reflective material representing a superior reflection characteristic. For example, the reflective electrode layer 12 may include one selected from the group consisting of Ag, Ni, Al, Rh, Pd, Ir, Ru, Mg, Zn, Pt, Au and Hf, or a multi-structure thereof, but the embodiment is not limited thereto.

Since the reflective electrode layer 12 reflects light generated from the active layer 4 and directed downward, the reflective electrode 12 may have the same size as that of the second conductive semiconductor layer 6, but the embodiment is not limited thereto.

The second electrode 16 may have the size at least smaller than that of the reflective electrode layer 12, but the embodiment is not limited thereto.

If the reflective electrode layer 12 represents an inferior ohmic contact characteristic, a transparent electrode layer representing a superior ohmic contact characteristic may be interposed between the reflective electrode layer 12 and the second conductive semiconductor layer 6, but the embodiment is not limited thereto. The transparent electrode layer may include a transparent conductive material to transmit light. The transparent conductive material may include at least one selected from the group consisting of ITO, IZO (In—ZnO), GZO (Ga—ZnO), AZO (Al—ZnO), AGZO (Al—Ga ZnO), IGZO (In—Ga ZnO), IrOx, RuOx, RuOx/ITO, Ni/IrOx/Au and Ni/IrOx/Au/ITO, but the embodiment is not limited thereto.

The first electrode 14 may be formed on a portion of the first conductive semiconductor layer 2, and the second electrode 16 may be formed on a portion of the second conductive semiconductor layer 6. For example, the first and second electrodes 14 and 16 may include one selected from the group consisting of Al, Ti, Cr, Ni, Pt, Au, W, Cu and Mo or the multi-structure thereof, but the embodiment is not limited thereto.

The first and second electrodes 14 and 16 may include a single layer or a multi-layer. The uppermost layer in the multi-layer may include a bonding pad to bond an external electrode thereto, but the embodiment is not limited thereto. Although not shown, current blocking layers may be provided at lower portions of the first and second electrodes 14 and 16 to prevent current from being concentrated on the lower portions of the first and second electrodes 14 and 16.

The size of each of the first and second electrodes 14 and 16 may be greater than the size of each current blocking layer so that the first and second electrodes 14 and 16 supply power to the first conductive semiconductor layer 2 and the reflective electrode layer 12. In addition, the first electrode 14 may be electrically connected with the first conductive semiconductor layer 2, and the second electrode 16 may be electrically connected with the reflective electrode layer 12.

For example, the first electrode 14 surrounds the current blocking layer while a bottom surface of the first electrode 14 may make contact with the first conductive semiconductor layer 2. For example, the second electrode 16 surrounds the current blocking layer while a bottom surface of the second electrode 16 may make contact with the reflective electrode layer 12, but the embodiment is not limited thereto.

The light emitting device 10, that is, the flip-chip type light emitting device, may include first and second bumps 18 and 19 formed on the first and second electrodes 14 and 16, respectively. The first and second bumps 18 and 19 may have various shapes such as a spherical shape, an oval shape, and a cylindrical shape, but the embodiment is not limited thereto.

The first and second bumps 18 and 19 are electrically connected with the first and second electrodes 14 and 16 while being physically connected with the first and second electrodes 1 and 16 through a die bonding scheme. For example, the bonding pads of the first and second electrodes 14 and 16 are melted so that the contact surfaces with the first and second bumps 18 and 19 may be formed in the bonding pads, but the embodiment is not limited thereto.

The solder pastes 26 and 28 and the first and second bumps 18 and 19 may include one or the alloy of at least two selected from the group consisting of metallic materials, such as Al, Ti, Cr, Ni, Pt, Au, W, Cu and Mo, representing superior electric conductivity, but the embodiment is not limited thereto.

The light emitting device 10 may be prepared in the form of a module and may be mounted on the body 20, but the embodiment is not limited thereto.

After filling the solder pastes 26 and 28 in the first and second recesses 114 and 116 of the body 20, the light emitting device 10 of FIG. 2 may be reversed at 180°, and then aligned in such a manner that the light emitting device 10 is located on the first and second recesses 114 and 116 of the body 20. In addition, after locating the first and second bumps 18 and 19 of the light emitting device 10 in the first and second recesses 114 and 116 by pressing the light emitting device 10, the solder pastes 26 and 28 are cooled and hardened. Therefore, since the first and second bumps 18 and 19 of the light emitting device 10 are fixed into the first and second recesses 114 and 116, a fixedness property of the light emitting device 10 can be improved.

The first and second bumps 18 and 19 of the light emitting device 10 may be formed in the first and second recesses 114 and 116. In this case, the difference in height between the first and second bumps 18 and 19 may be made due to the difference in height between the first and second electrodes 14 and 16. In other words, a bottom surface of the second bump 19 may be located lower than a bottom surface of the first bump 18.

The bottom surface of the second bump 19 may make contact with the top surface of the second electrode layer 24 formed in the second hole 112, but the embodiment is not limited thereto. To the contrary, since the bottom surface of the first bump 18 is located higher than the bottom surface of the second bump 19, the bottom surface of the first bump 18 may not make contact with the top surface of the first electrode layer 22 formed in the first hole 110, but the embodiment is not limited thereto.

The solder paste 26 may be interposed between the first bump 18 and the first electrode layer 22 in the first recess 114, and the solder paste 28 may be interposed between the second bump 19 an the second electrode layer 24 in the second recess 116. As the second bump 19 is located to almost the bottom surface of the second recess 116, the solder paste 28 in the second recess 116 may get out of the second recess 116 and be provided around the upper region of the second bump 19.

Before the cooling process is performed, in order to prevent the light emitting device 10 from being inclined, the level state of the light emitting device 10 can be maintained by a pressing unit (not shown), but the embodiment is not limited thereto. Since the light emitting device 10 is fixed in the state that the light emitting device 10 is maintained in the level state, the light emitting device 10 can be prevented from being inclined.

In addition, since the solder pastes 26 and 28 filled in the first and second recesses 114 and 116 are prevented from getting out of the cavity 25 by the first and second bumps 18 and 19 of the light emitting device 10, the performance of the light emitting device 10 can be prevented from being degraded due to the over cover of the solder pastes 26 and 28. In this case, the degradation of the performance of the light emitting device 10 may refer to the electrical short occurring in the light emitting structure 8 as the solder pastes 26 and 28 are over covered on the light emitting structure 8, so that the solder pastes 26 and 28 are formed to a peripheral portion of the light emitting structure 8, or the degradation of the light efficiency caused as the light is not emitted to the outside of the light emitting structure 8.

In addition, the contact areas between the first and second bumps 18 and 19 and the solder pastes 26 and 28 are maximized, and the heat is discharged from the light emitting device 10 to the outside through the first and second bumps 18 and 19, the solder pastes 26 and 28, and the first and second electrode layers 22 and 24, so that the heat radiation performance of the light emitting device 10 can be improved.

The molding member 30 may surround the light emitting device 10. The molding member 30 may be formed in the cavity 25 of the body 20. The top surface of the molding member 30 may be aligned line with the top surface of the body 20, or may be higher than or lower than the top surface of the body 20, but the embodiment is not limited thereto.

The molding member 30 may include a material representing a transmission characteristic, a heat radiation characteristic, and/or an insulating characteristic. For example, the molding member 30 may include a silicon material or an epoxy material, but the embodiment is not limited thereto. The molding member 30 may contain a phosphor to covert the wavelength of light, but the embodiment is not limited thereto.

Figure 5:
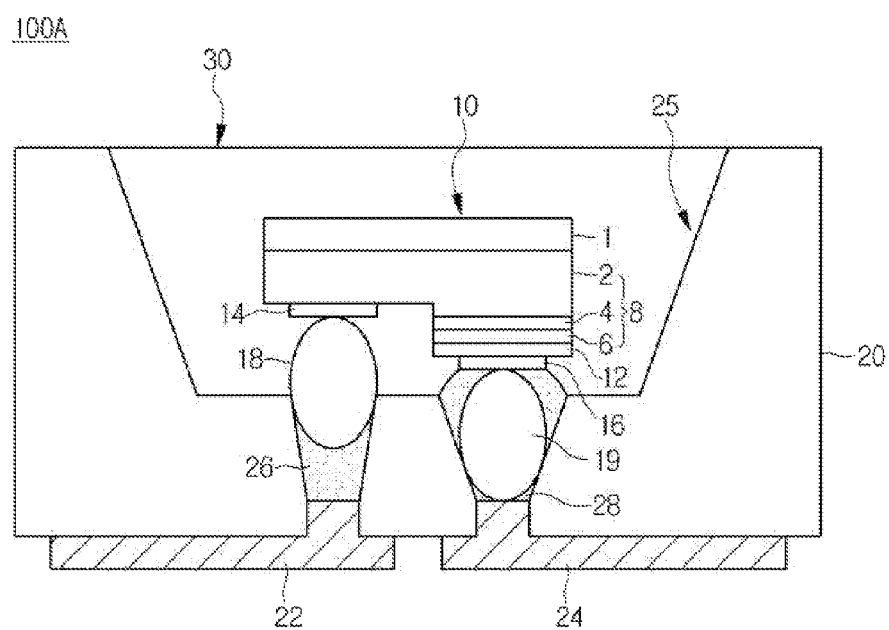
FIG. 5 is a sectional view showing a light emitting device package according to a second embodiment.

FIG. 5 is a sectional view showing a light emitting device package according to a second embodiment. The second embodiment is substantially similar to the first embodiment except that the inner lateral sides of the first and second recesses 114 and 116 have inclined surfaces. In the following description of the second embodiment, the same reference numerals will be assigned to the same elements having the same shape or function as those of the first embodiment, and the details thereof will be omitted.

Referring to FIG. 5, the light emitting device package according to the second embodiment may include a body 20, first and second electrode layers 22 and 24, a light emitting device 10, and a molding member 30. The first and second recesses 114 and 116 may be formed in the cavity 25 of the body 20. The inner lateral sides of the first and second recesses 114 and 116 according to the first embodiment (see FIG. 1) have surfaces perpendicular to bottom surfaces thereof, and the inner lateral sides of the first and second recesses 114 and 116 according to the second embodiment (see FIG. 2) have surfaces inclined with respect to bottom surfaces thereof. The diameter of an upper region of the first recess 114 may be greater than that of a lower region of the first recess 114. The diameter of an upper region of the second recess 116 may be greater than that of a lower region of the second recess 116.

The light emitting device 10 may be a flip-chip type light emitting device, but the embodiment is not limited thereto.

The first and second bumps 18 and 19 of the light emitting device 10 may be formed in the first and second recesses 114 and 116. The second bump 19 may make contact with the top surface of the second electrode layer and the inclined surface of the second recess 116. A solder paste 28 may be provided in a space formed among an outer surface of a lower region of the second bump 19, a top surface of the second electrode layer 24, and the inner lateral side of the second recess 116, but the embodiment is not limited thereto.

The first bump 18 may make contact with the inclined surface of the first recess 114 and may be physically spaced apart from the top surface of the first electrode layer 22. A solder paste 26 may be provided between the first bump 18 and the top surface of the first electrode layer 220, but the embodiment is not limited thereto.

Figure 6:
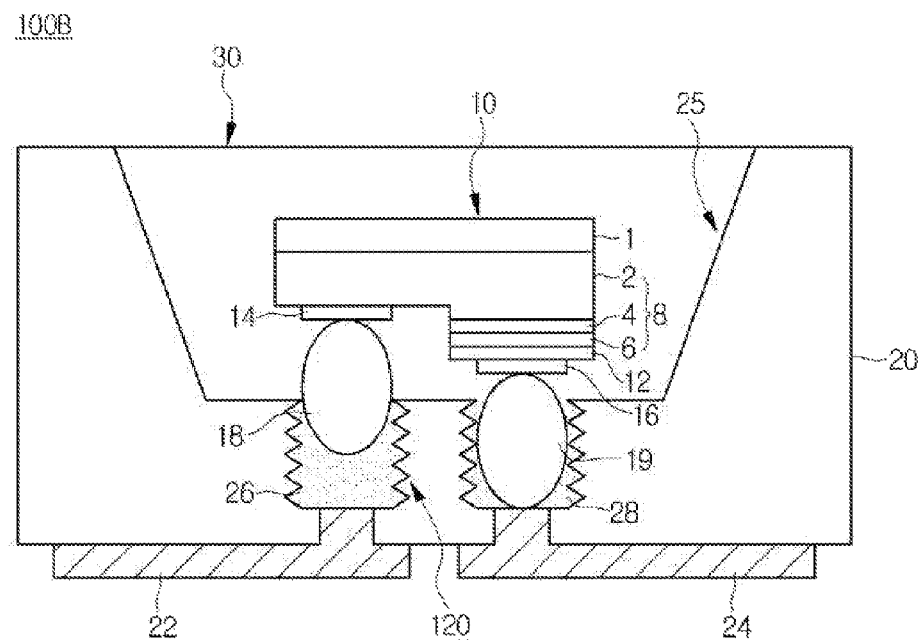
FIG. 6 is a sectional view showing a light emitting device package according to a third embodiment.

FIG. 6 is a sectional view showing a light emitting device package according to a third embodiment. The third embodiment is substantially similar to the first embodiment except that the inner lateral sides of the first and second recesses 114 and 116 have a concave-convex pattern 120. In the following description of the third embodiment, the same reference numerals will be assigned to the same elements having the same shape or function as those of the first embodiment, and the details thereof will be omitted.

Referring to FIG. 6, the light emitting device package according to the third embodiment may include a body 20, first and second electrode layers 22 and 24, a light emitting device 10, and a molding member 30. The first and second recesses 114 and 116 may be formed in the cavity 25 of the body 20.

Figure 7:
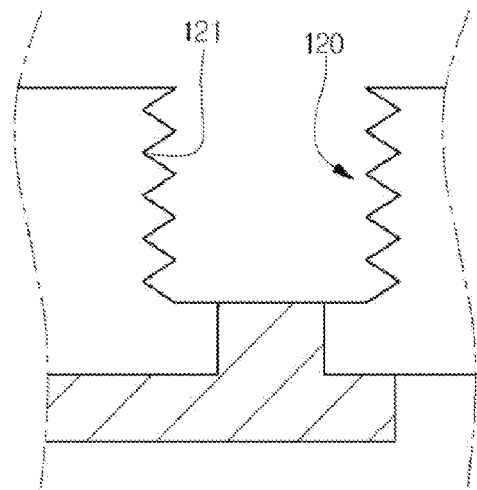
FIG. 7 is a sectional view showing a concave-convex pattern of FIG. 6.

As shown in FIG. 7, the inner lateral sides of the first and second recesses 114 and 116 may have the concave-convex pattern 120, but the embodiment is not limited thereto. The concave-convex pattern 120 may include a concave pattern 121 and a convex pattern. The concave pattern 121 may have a shape recessed outward from the convex pattern, but the embodiment is not limited thereto. To the contrary, the convex pattern may have a shape recessed inward from the concave pattern 121, but the embodiment is not limited thereto.

Although not shown, concave-convex patterns 120 may be formed on bottom surfaces of the first and second recesses 114 and 116 except for regions of the first and second recesses 114 and 116 spatially connected with the first and second holes 110 and 112 having the first and second electrode layers 22 and 24 therein, but the embodiment is not limited thereto. The concave-convex pattern 120 may have a V shape, a dent shape, or a curved shape, but the embodiment is not limited thereto.

Since the solder pastes 26 and 28 may be filled in the concave patterns 121 of the concave-convex pattern 120, the occupation area of the solder pastes 26 and 28 in the first and second recesses 114 and 116 can be maximized. In addition, since the solder pastes 26 and 28 pushed by the first and second bumps 18 and 19 of the light emitting device 10 are filled in the concave patterns 121, the solder pastes 26 and 28 may less get out of the cavity 25 via the first and second bumps 18 and 19. The degradation of the performance of the light emitting device 10 resulting from the over cover of the solder pastes 26 and 28 can be minimized.

Figure 8:
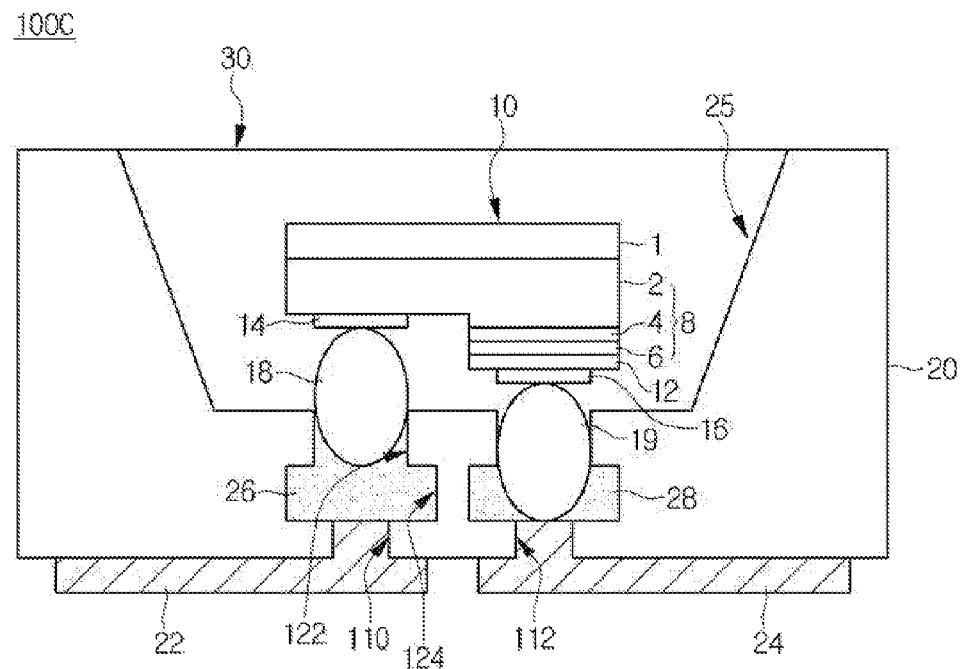
FIG. 8 is a sectional view showing a light emitting device package according to a fourth embodiment.

FIG. 8 is a sectional view showing a light emitting device package according to a fourth embodiment. The fourth embodiment is substantially similar to the first embodiment except that the inner lateral sides of the first and second recesses have at least one concave part 124. In the following description of the fourth embodiment, the same reference numerals will be assigned to the same elements having the same shape or function as those of the first embodiment, and the details thereof will be omitted. Referring to FIG. 8, the light emitting device package according to the fourth embodiment may include a body 20, first and second electrode layers 22 and 24, a light emitting device 10, and a molding member 30.

Figure 9:
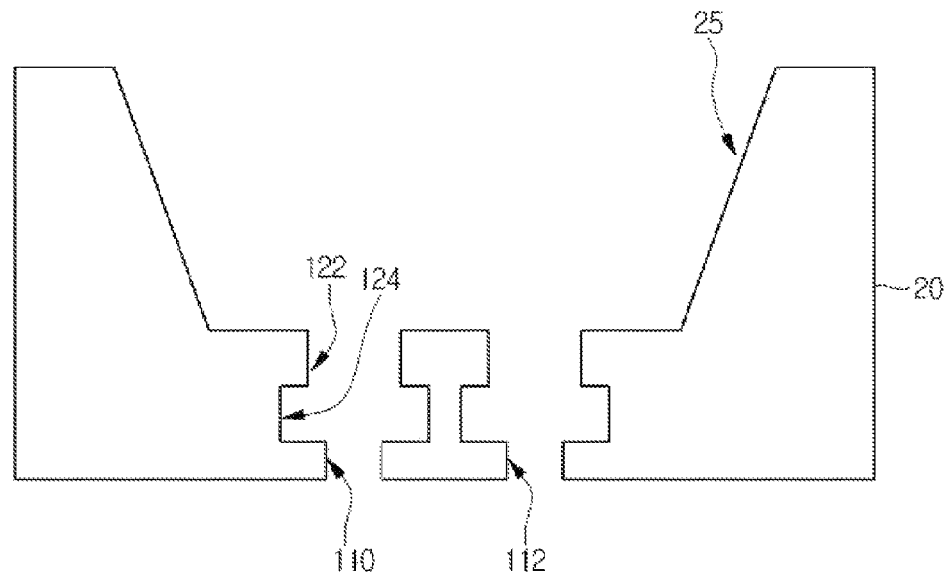
FIG. 9 is a sectional view showing a body of FIG. 8.

As shown in FIG. 9, the body 20 may include an upper region including first and second recesses 1122 and a lower region including first and second holes 110 and 112 spatially connected with the first and second recesses 122. An inner lateral side of at least one of the first and second recesses 122 may include at least one concave part 124.

Although FIG. 9 shows that concave parts 124 are formed in both of the first and second recesses 122, the embodiment is not limited thereto. Each concave part 124 may have a shape concave outward from the inner lateral side of each of the first and second recesses 122, but the embodiment is not limited thereto. The concave part 124 shown in FIG. 9 may have a dent shape, but the embodiment is not limited thereto.

Although FIG. 9 shows that one concave part 124 is formed, a plurality of concave parts may be formed on the inner lateral side of at least one of the first and second recesses 122. The concave parts 124 may be formed in a closed loop along peripheral portions of the inner lateral sides of the first and second recesses 122.

In addition, the concave parts 124 may be formed at a predetermined interval along the peripheral portions of the first and second recesses 122, or may be randomly formed along the peripheral portions of the first and second recesses 122. The concave parts 124 may be physically spaced apart from each other, but the embodiment is not limited thereto. The distance between the concave parts 124 that face each other may be greater than the diameter of each of the first and second recesses 122, and the diameter of each of the first and second recesses 122 may be greater than the diameter of each of the first and second holes 110 and 112, but the embodiment is not limited thereto.

Figure 10:
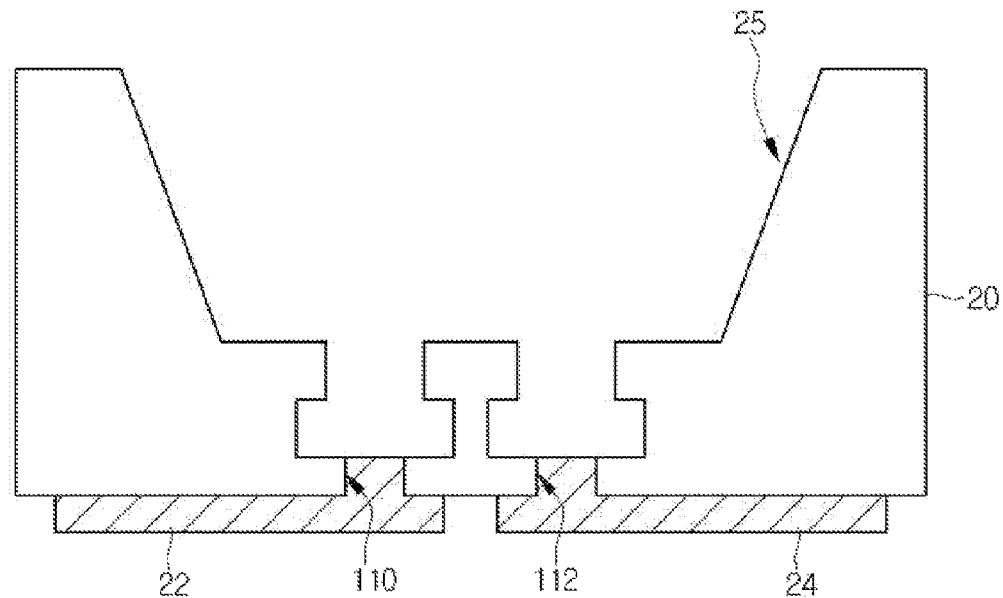
FIG. 10 is a sectional view showing a body having an electrode layer of FIG. 8.

As shown in FIG. 10, the first and second electrode layers 22 and 24 may be formed in the first and second holes 110 and 112 of the body 20. In other words, a first protrusion part protruding from the first electrode layer 22 may be formed in the first hole 110 and may be exposed by the first recess 122. A second protrusion part protruding from the second electrode layer 24 may be formed in the second hole and may be exposed by the second recess 122.

Since the solder pastes 26 and 28 may be filled in the concave patterns 124, the occupation area of the solder pastes in the first and second recesses 122 can be maximized. In addition, since the solder pastes 26 and 28 pushed by the first and second bumps 18 and 19 of the light emitting device 10 are filled in the concave patterns 124, the solder pastes 26 and 28 may less get out of the cavity 25 via the first and second bumps 18 and 19. The degradation of the performance of the light emitting device 10 resulting from the over cover of the solder pastes 26 and 28 can be minimized.

Figure 11:
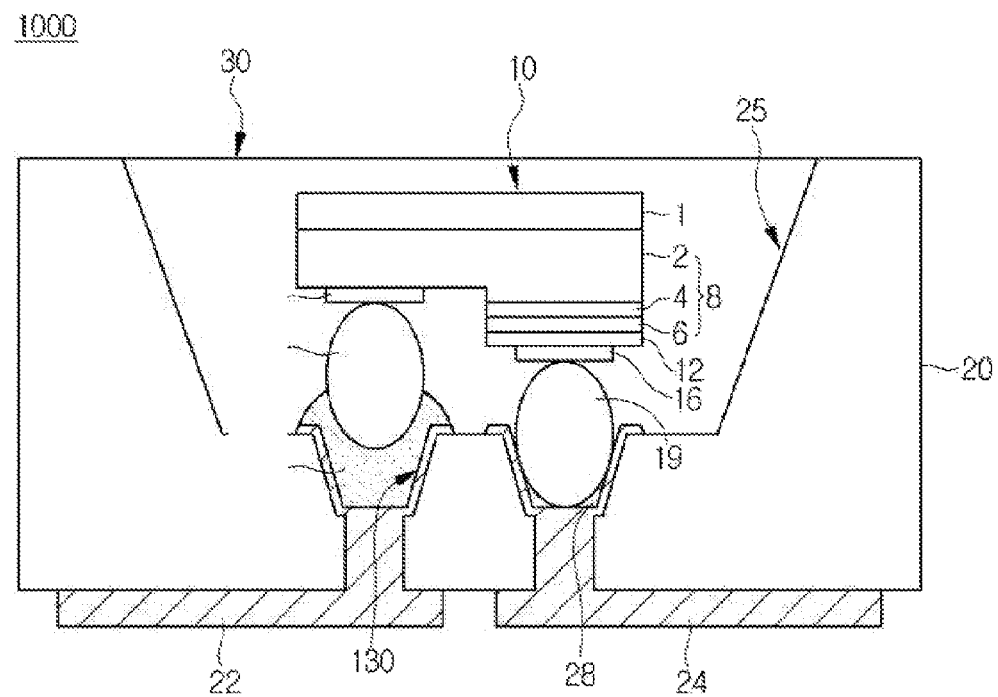
FIG. 11 is a sectional view showing a light emitting device package according to a fifth embodiment.

FIG. 11 is a sectional view showing a light emitting device package according to the fifth embodiment. The fifth embodiment is substantially similar to the first to fourth embodiments except for the shapes of the first and second electrode layers 22 and 24. In the following description of the fifth embodiment, the same reference numerals will be assigned to the same elements having the same shapes or functions as those of the first to fourth embodiments, and the details thereof will be omitted. The fifth embodiment may be applied to the first to fourth embodiments.

For the convenience of explanation, the first and second electrode layers 22 and 24 may be applicable to the body 20 (see FIG. 5) according to the second embodiment, but the embodiment is not limited thereto.

Referring to FIG. 11, a light emitting device package according to the fifth embodiment may include a body 20, first and second electrode layers 22 and 24, a light emitting device 10, and a molding member 30. The body 20 may include an upper region including the first and second recesses 114 and 116, and a lower region including first and second holes 110 and 112 spatially connected with the first and second recesses 114 and 116.

Figure 12:
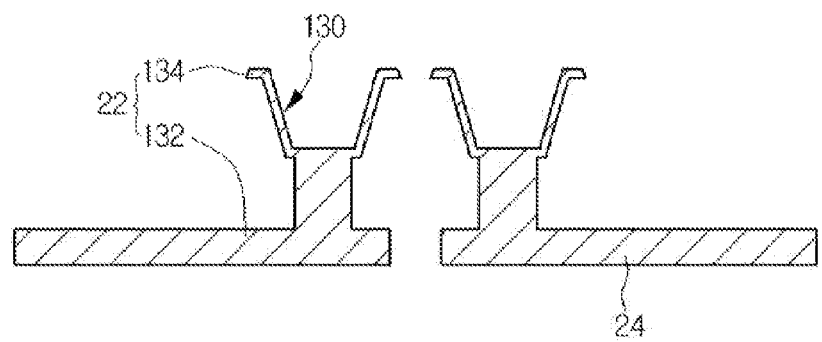
FIG. 12 is a sectional view showing an electrode layer of FIG. 11.

As shown in FIG. 12, each of the first and second electrode layers 22 and 24 may include an electrode support 132 and an electrode contact part 134, but the embodiment is not limited thereto. The electrode support 132 may substantially similar to each of the first and second electrode layers 22 and 24 formed on the bottom of the body 20 disclosed in each of the first to fourth embodiments. The electrode support 132 may be formed on the bottom surface of the body 20.

The electrode contact parts 134 may be electrically connected with the first and second bumps 18 and 19 of the light emitting device 10 through the solder pastes 26 and 28. The electrode contact part 134 may include a protrusion part protruding upward from of the electrode support 132 and first and second contact pads branching from the protrusion part, but the embodiment is not limited thereto.

The protrusion parts are formed in the first and second holes 110 and 112 of the body 20, and the first and second contact pads may be formed in the first and second recesses 114 and 116 of the body 20. In other words, the lateral sides of the protrusion part may be surrounded by the body 20. The first contact pad may be formed on a first lateral side of the first recess 114 or the second recess 116, and the second contact pad may be formed on a second lateral side of the first recess 114 or the second recess 116, but the embodiment is not limited thereto. The first lateral side may be a left lateral side of the first recess 114 or the second recess 116, and the second lateral side may be a right lateral side of the first recess 114 or the second recess 116.

The first and second contact pads may have a closed loop structure formed along at least peripheral portions of the inner lateral sides of the first recess 114 or the second recess 116, but the embodiment is not limited thereto. In order to enhance a fixedness property of the first and second electrode layers 22 and 24, upper regions of the first and second contact pads may be formed on a portion of the bottom surface of the cavity 25, but the embodiment is not limited thereto.

Spaces, which are mutually separated from each other, may be formed between the first and second contact pads, and the solder pastes 26 and 28 may be filled in the spaces, but the embodiment is not limited thereto. An outer surface of each of the first and second contact pads may have a shape corresponding to that of an inner surface of each of the first and second recesses 114 and 116, but the embodiment is not limited thereto. The electrode support 132 may be formed integrally with the electrode contact part 134, but the embodiment is not limited thereto.

Figure 13:
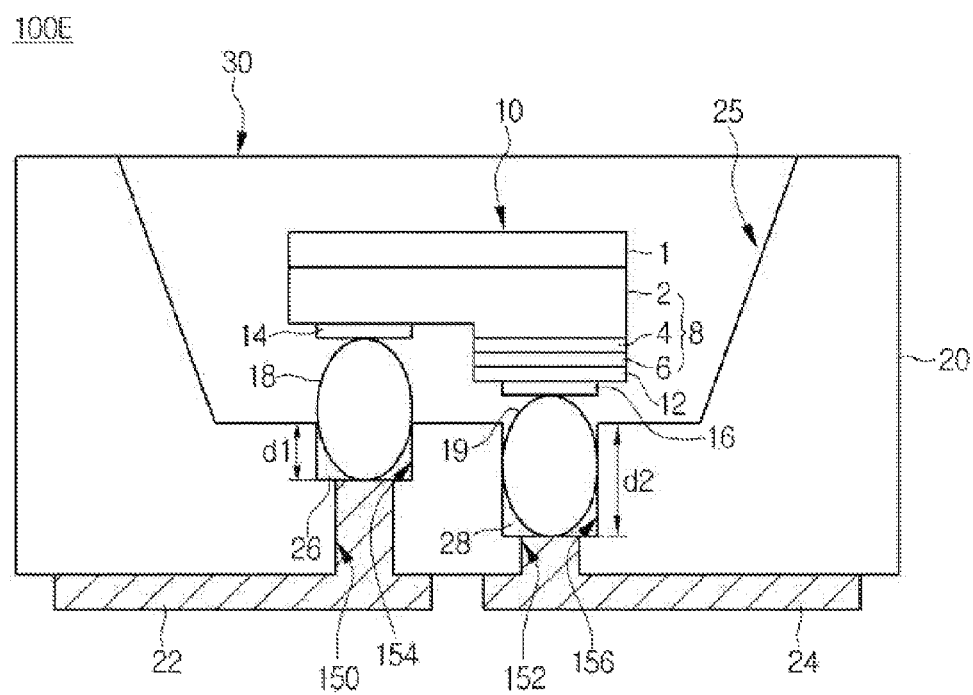
FIG. 13 is a sectional view showing a light emitting device package according to a sixth embodiment.
Figure 14:
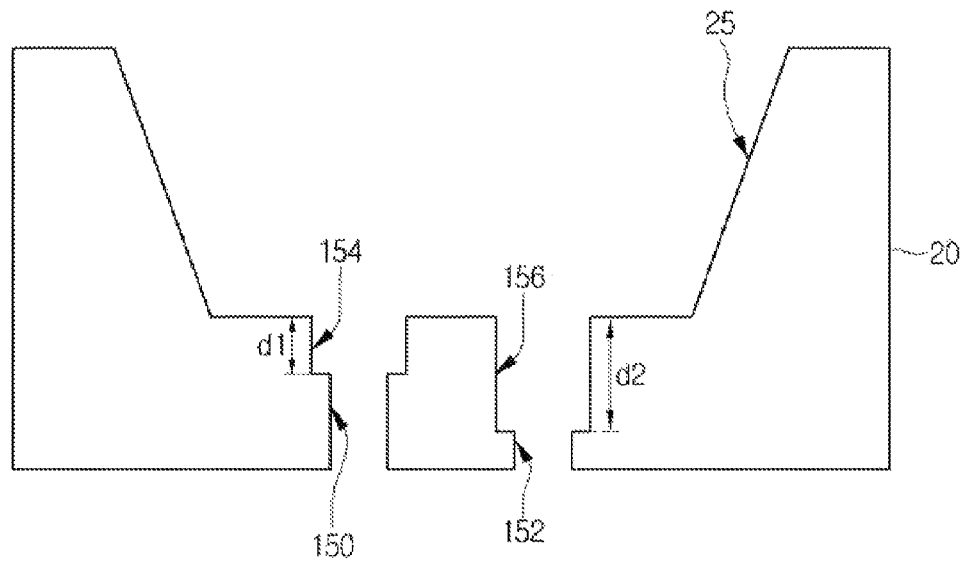
FIG. 14 is a sectional view showing a body of FIG. 13.

FIG. 13 is a sectional view showing a light emitting device package according to a sixth embodiment. The sixth embodiment is substantially similar to the first to fifth embodiments except that the first and second recesses 154 and 156 have mutually different depths. In the following description of the sixth embodiment, the same reference numerals will be assigned to the same elements having the same shapes or functions as those of the first to fifth embodiments, and the details thereof will be omitted. The sixth embodiment may be applied to the first to fifth embodiments. Referring to FIG. 13, a light emitting device package according to the fifth embodiment may include a body 20, first and second electrode layers 22 and 24, a light emitting device 10, and a molding member 30. As shown in FIG. 14, the body 20 may include an upper region including first and second recesses 154 and 156, and a lower region including first and second holes spatially connected with the first and second recesses 154 and 156.

The first recess 154 may have a depth d1 different from a depth d2 of the second recess 156. The depths d1 and d2 of the first and second recesses 154 and 156 may be formed based on the bottom surface of the cavity 25, but the embodiment is not limited thereto. Due to the depth difference d2−d1 between the first and second recesses 154 and 156, the first and second bumps 18 and 19 of the light emitting device 10 may make contact with top surfaces of the first and second electrode layers 22 and 24, respectively, but the embodiment is not limited thereto.

Since the first bump 18 of the light emitting device 10 is fixed onto the top surface of the first electrode layer 22 due to the shape change of the first and second recesses 154 and 156, the light emitting device 10 can be previously prevented from being inclined left due to the space between the first bump 18 and the first electrode layer 22 provided in the light emitting device 10. Accordingly, the light emitting device 10 can be more perfectly maintained at a level state.

On the assumption that the first and second bumps 18 and 19 have equal heights, and the first and second electrodes 14 and 16 have equal thicknesses, the depth difference d2−d1 between the first and second recesses 154 and 156 may be equal to or slightly greater than the total thickness of the reflective electrode layer 12, the second conductive semiconductor layer 6, and the active layer 4. If the depth difference d2−d1 between the first and second recesses 154 and 156 is greater than the total thickness of the reflective electrode layer 12, the second conductive semiconductor layer 6, and the active layer 4, the etching height of the first conductive semiconductor layer 2 is reflected in the total thickness of the reflective electrode layer 12, the second conductive semiconductor layer 6 and the active layer 4.

Figure 15:
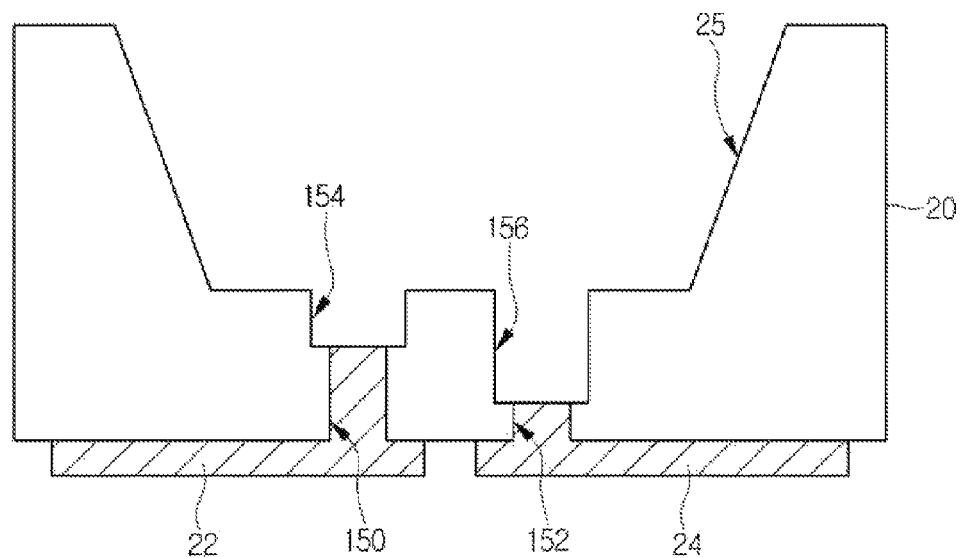
FIG. 15 is a sectional view showing a body having an electrode layer of FIG. 13.

As shown in FIG. 15, the first and second electrode layers 22 and 24 may be formed in the first and second holes 150 and 152, respectively, and on the bottom surface of the body 20.

Figure 16:
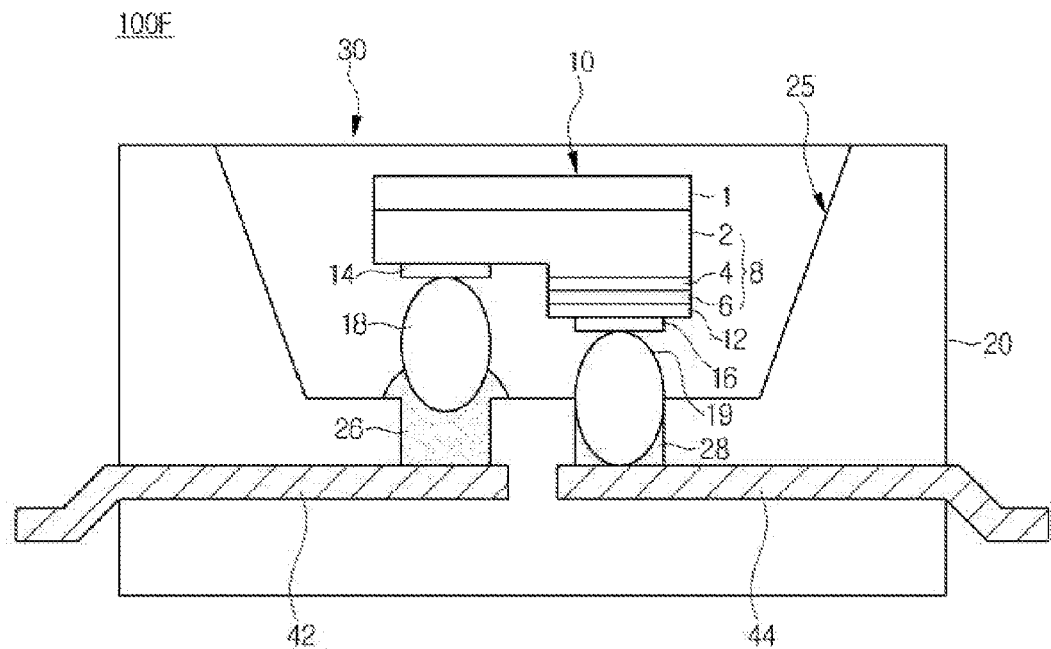
FIG. 16 is a sectional view showing a light emitting device package according to a seventh embodiment.

FIG. 16 is a sectional view showing a light emitting device package according to a seventh embodiment. The seventh embodiment is substantially similar to the first to sixth embodiments except for the arrangement locations of the first and second electrode layers 42 and 44. In the following description of the seventh embodiment, the same reference numerals will be assigned to the same elements having the same shapes or functions as those of the first to sixth embodiments, and the details thereof will be omitted. The seventh embodiment may be applied to the first to sixth embodiments. Referring to FIG. 16, a light emitting device package according to the seventh embodiment may include a body 20, first and second electrode layers 42 and 44, a light emitting device 10, and a molding member 30.

Figure 17:
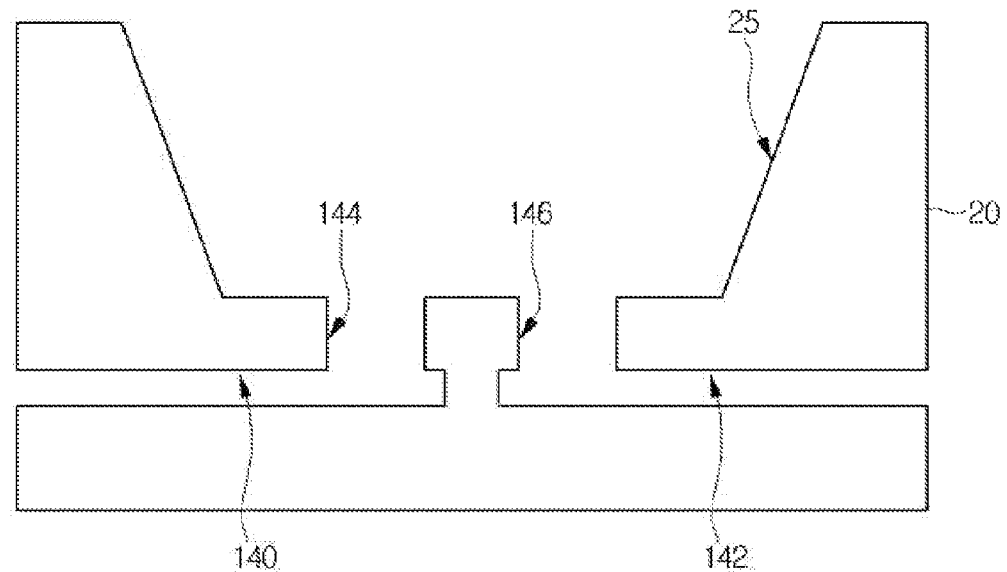
FIG. 17 is a sectional view showing a body of FIG. 16.

As shown in FIG. 17, the body 20 may include an upper region including first and second recesses 144 and 146, and a lower region including first and second holes 140 and 142 spatially connected with the first and second recesses 144 and 146.

Differently from the first and second holes 110 and 112 according to the first to sixth embodiments, the first and second holes 140 and 142 according to the seventh embodiment may be horizontally formed through the body 20. The first hole 140 is formed through the body 20 in a right horizontal direction from a first lateral side of the body 20 while being spatially connected with the first recess 144. The second hole 142 is formed through the body 20 in a left horizontal direction from a second lateral side of the body 20 while being spatially connected with the second recess 146.

Figure 18:
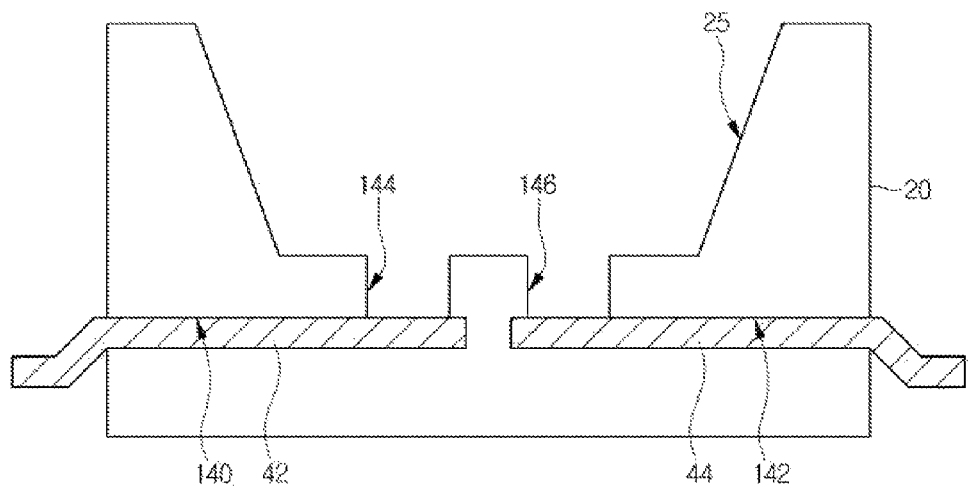
FIG. 18 is a sectional view showing a body having an electrode layer of FIG. 16.

As shown in FIG. 18, the first and second electrode layers 42 and 44 may be formed in the first and second holes 140 and 142, respectively. In other words, the first electrode layer 42 may be exposed by the first recess 144, and formed in the first hole 140 of the body 20. In addition, the first electrode layer 42 may protrude out of the first lateral side of the body 20. The second electrode layer 44 may be exposed by the second recess 146, and formed in the second hole 142 of the body 20. In addition, the second electrode layer 44 may protrude out of the second lateral side of the body 20.

The width of the body 20 between the first and second holes 140 and 142 may be narrower than the width of the body 20 between the first and second holes 140 and 142. In this case, a portion of the first electrode layer 42 exposed by the first recess 144 may be overlapped with a portion of the body 20 between the first and second recesses 144 and 146. A portion of the second electrode layer 144 exposed by the second recess 146 may be overlapped with a portion of the body 20 between the first and second recesses 144 and 146. Therefore, the first and second electrode layers 42 and 44 may be more strongly fixed to the body 20.

The first and second bumps 18 and 10 of the light emitting device 10 may be electrically connected with the first and second electrode layers 42 and 44 exposed by the first and second recesses 144 and 166, respectively, through the solder pastes 26 and 28.

Figure 19:
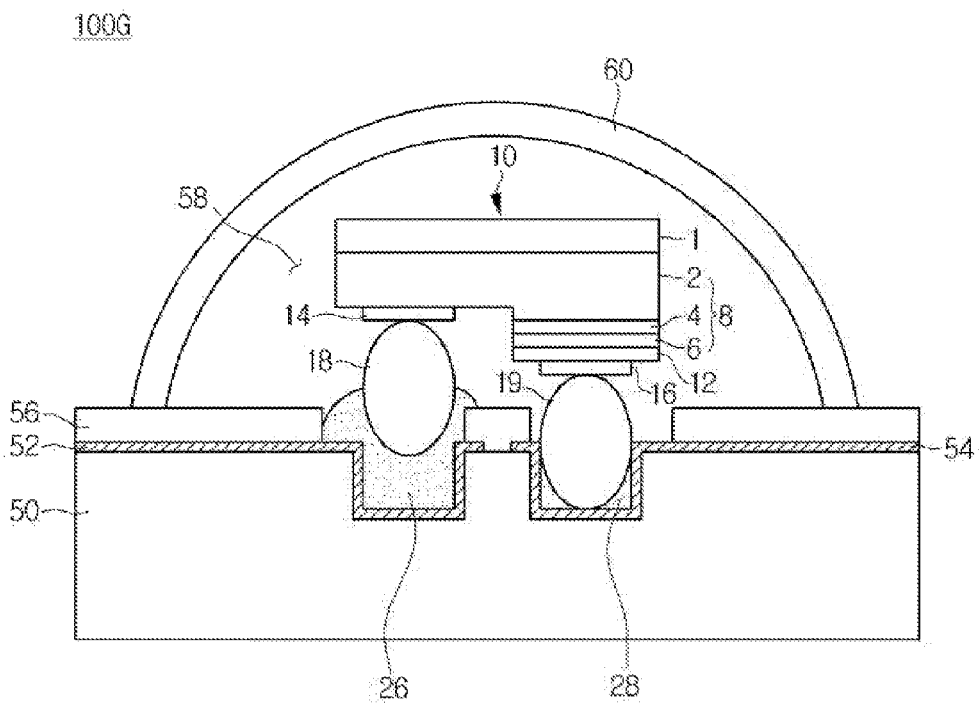
FIG. 19 is a sectional view showing a light emitting device package according to an eighth embodiment.

FIG. 19 is a sectional view showing a light emitting device package according to an eighth embodiment. The eighth embodiment is substantially similar to the first to seventh embodiments except for a base substrate 50. In the following description of the eighth embodiment, the same reference numerals will be assigned to the same elements having the same shapes or functions as those of the first to seventh embodiments, and the details thereof will be omitted. The eighth embodiment may be applied to the first to seventh embodiments.

Referring to FIG. 19, a light emitting device package according to the eighth embodiment may include a base substrate 50, first and second electrode layers 52 and 54, a light emitting device 10, and a molding member 58. The light emitting device package may include a COB (chip on board) light emitting device package or a COF (chip on film) light emitting device package, but the embodiment is not limited thereto.

The light emitting device package may further include a lens 60 on the molding member 58, but the embodiment is not limited thereto. The lens 60 may be attached to the top surface of the molding member 58 after being previously been processed, or may be directly formed on the molding member 58 by using a resin material such as epoxy or silicone, but the embodiment is not limited thereto.

Although the lens 60 is formed on the molding member 58 in the description made with reference to FIG. 9, the lens 60 may be directly provided on the light emitting device 10 without the molding member 58, but the embodiment is not limited thereto. The base substrate 50 may include one of a resin substrate such as silicon, a PCB substrate, a metallic substrate, and a plastic substrate, but the embodiment is not limited thereto.

Figure 20:
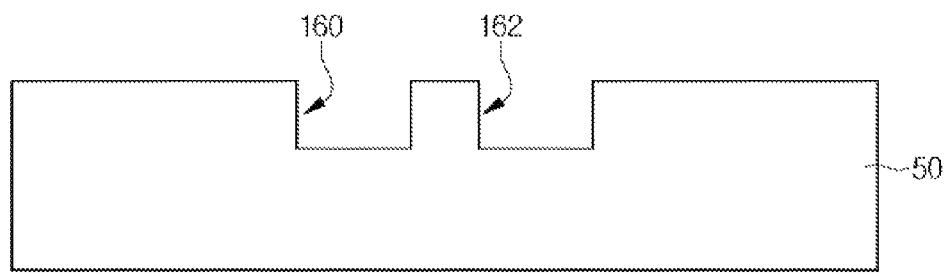
FIG. 20 is a sectional view showing a body of FIG. 19.

As shown in FIG. 20, first and second recesses 160 and 162 may be formed in the base substrate 50. The first and second recesses 160 and 162 may be formed through an etch process or a molding process, but the embodiment is not limited thereto.

Figure 21:
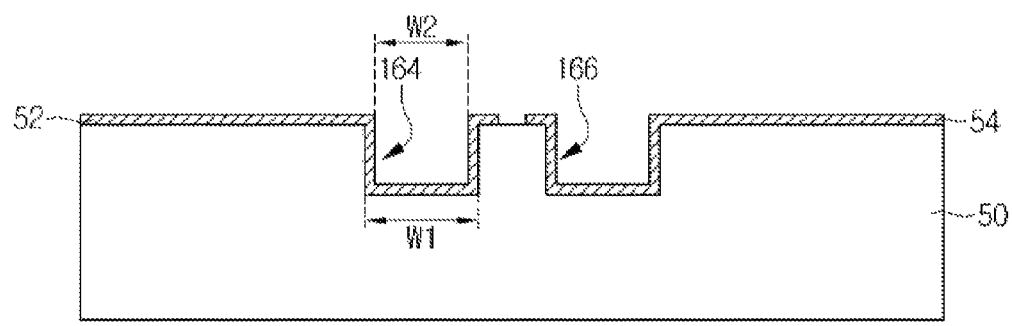
FIG. 21 is a sectional view showing a body having an electrode layer of FIG. 19.

As shown in FIG. 21, the first and second electrode layers 52 and 54 may be formed on the base substrate 50. The first electrode layer 52 may be formed in the first recess 160, and the second electrode layer 54 may be formed in the second recess 162. The first and second electrode layers 52 and 54 are electrically insulated from each other and spaced apart from each other.

A first recess 164 may be formed in the first electrode layer 52 in the first recess 160 of the base substrate 50, and a second recess 166 may be formed in the second electrode layer 54 in the second recess 162 of the base substrate 50.

It is assumed that the thickness of each of the first and second electrode layers 52 and 54 is assigned to a variable t, the width of each of the first and second recesses 160 and 162 of the base substrate 50 is assigned to a variable W1, and the width of each of the first recess 164 formed in the first electrode layer 52 and the second recess 166 formed in the second electrode layer 54 is assigned to a variable W2. In this case, the width W1 of each of the first and second recesses 160 and 162 of the base substrate 50 is expressed through following Equation 1.

$$W1 = W2 + 2t \quad \text{Equation 1}$$

The thickness of each of the first and second electrode layers 52 and 54 may be smaller than the depth of each of the first and second recesses 160 and 162 formed in the substrate 50. In other words, the depth of each of the first and second recesses 160 and 162 formed in the base substrate 50 may be in the range of three times to ten times greater than the thickness of each of the first and second electrode layers 52 and 54, but the embodiment is not limited thereto. If the depth of each of the first and second recesses 160 and 162 formed in the base substrate 50 is three times or less of the thickness of each of the first and second electrode layers 52 and 54, a small amount of solder paste 26 or 28 is filled in the first recess 164 formed in the first electrode layer 52 provided in the first recess 160 of the base substrate 50, or the second recess 166 formed in the second electrode layer 54 provided in the second recess 162 of the base substrate 50. Accordingly, the solder pastes 26 and 28 do not serve as media between the first and second bumps 18 and 19 and the first and second electrode layers 52 and 54 provided in the light emitting device 10. If the depth of each of the first and second recesses 160 and 162 formed in the base substrate 50 is ten times or more of the thickness of each of the first and second electrode layers 52 and 54, a large amount of solder paste 26 or 28 must be filled in the first recess 164 formed in the first electrode layer 52 provided in the first recess 160 of the base substrate 50, or the second recess 166 formed in the second electrode layer 54 provided in the second recess 162 of the base substrate 50. Accordingly, the cost of the solder pastes 26 and 28 is increased, and the depth of the first recess 164 formed in the first electrode layer 52 provided in the first recess 160 of the base substrate 50 or the depth of the second recess 166 formed in the second electrode layer 54 provided in the second recess 162 of the base substrate 50 is significantly increased. Therefore, the distances between the first and second bumps 18 and 19 and the first and second electrode layers 52 and 54 provided in the light emitting device 10 are increased, so that power may not be smoothly supplied.

A protective layer 56 may be formed on the first and second electrode layers 52 and 54. The protective layer 56 may have openings at least equal to or greater than the first recess 164 in the first electrode layer 52 and the second recess 166 in the second electrode layer 54 in size, but the embodiment is not limited thereto. The openings may be equal to or greater than each of the first and second recesses 160 and 162 in the base substrate 50 in size, but the embodiment is not limited thereto. The protective layer 56, which protects the first and second electrode layers 52 and 54 from the outside, may include an inorganic insulating material such as SiOx, an organic insulating material, or a plastic insulating material, but the embodiment is not limited thereto.

After the solder pastes 26 and 28 have been filled in the first recess 164 formed in the first electrode layer 52 and in the second recess 166 formed in the second electrode layer 54, the first and second bumps 18 and 19 of the light emitting device 10 are formed in the first recess 164 formed in the first electrode layer 52 and the second recess 166 formed in the second electrode layer 54 through the openings of the protective layer 56, and the solder pastes 26 and 28 are hardened, so that the first and second bumps 18 and 19 of the light emitting device 10 may be fixed.

The body 20 according to the first to seventh embodiments and the base substrate 50 according to the eighth embodiment may be named "substrate", but the embodiment is not limited thereto.

Light emitting device packages 100, 100A, 100B, 100C, 100D, 100E, 100F, and 100G according to the first to eighth embodiments are applicable to a light unit. The light unit is applicable to a display and a lighting device. For example, the light unit is applicable to units such as lighting lamps, signal lamps, vehicle headlights, scoreboards and indicators.

According to the embodiments, before cooling the solder pastes, the light emitting device can be maintained at a level state so that the light emitting device can be prevented from being inclined.

According to the embodiment, since the solder pastes filled in the first and second recesses formed in the body can be prevented from getting out of the cavity by the first and second bumps of the light emitting device, the degradation of the performance of the light emitting device resulting from the over cover of the solder pastes can be prevented.

According to the embodiment, the contact areas between the first and second bumps and the solder pastes are maximized, so that heat is discharged from the light emitting device from the outside through the first and second bumps, the solder pastes, and the first and second electrode layers, so the performance of the heat radiation of the light emitting device can be improved.

The embodiments provide a light emitting device package capable of improving the fixedness property of a light emitting device.

The embodiments provide a light emitting device package capable of preventing a light emitting device from being inclined.

The embodiments provide a light emitting device package capable of preventing the performance of a light emitting device from being degraded due to the over cover of pastes.

The embodiments provide a light emitting device package capable of improving the heat radiation.

According to the embodiment, there is provided a light emitting device package including a body having a cavity therein, first and second recesses inside the cavity in the body, first and second electrode layers in the first and second recesses, a light emitting device on the first and second electrode layers, and first and second bumps provided under the light emitting device and fixed into the first and second recesses.

According to the embodiment, there is provided a light emitting device package including a substrate, first and second recesses in the substrate, and first and second electrode layers in the first and second recesses. The first and second electrode layers include first and second recesses corresponding to the first and second recesses formed in the substrate. The light emitting device package includes a light emitting device provided on the first and second electrode layers, first and second bumps provided under the light emitting device and formed in the first and second recesses formed in the first and second electrode layers, and a protective layer provided on the first and second electrode layers and having openings through which the first and second bumps.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device package comprising:
a body having a cavity therein;
first and second recesses inside the cavity in the body;
first and second electrode layers in the first and second recesses;
a light emitting device on the first and second electrode layers;
first and second bumps provided under the light emitting device and attached to the first and second recesses; and
solder pastes filled in the first and second recesses to fix the first and second electrode layers to the light emitting device,
wherein the solder pastes surrounds bottom and side of one of the first and second bumps.

2. The light emitting device package of claim 1, further comprising:
a first hole connected with the first recess and formed through the body; and
a second hole connected with the second recess and formed through the body,
wherein the first electrode layer is formed in the first hole, and the second electrode layer is formed in the second hole.

3. The light emitting device package of claim 2, wherein a diameter of at least one of the first and second recesses is greater than a diameter of at least one of the first and second holes.

4. The light emitting device package of claim 2, wherein the first and second electrode layers extend from the first and second holes, respectively, to a bottom surface of the body.

5. The light emitting device package of claim 1, wherein a bottom surface of the first bump makes contact with the first electrode layer, and the first recess has a depth equal to a depth of the second recess.

6. A light emitting device package comprising:
a body having a cavity therein;
first and second recesses inside the cavity in the body;
first and second electrode layers in the first and second recesses;
a light emitting device on the first and second electrode layers;
first and second bumps provided under the light emitting device and attached into the first and second recesses; and
solder pastes filled in the first and second recesses to fix the first and second electrode layers to the light emitting device,
wherein the first and second recesses have inner lateral sides inclined with respect to bottom surfaces thereof,
wherein the solder pastes surrounds bottom and side of one of the first and second bumps.

7. The light emitting device package of claim 6, wherein lower regions of the first and second recesses have diameters greater than diameters of upper regions of the first and second recesses.

8. The light emitting device package of claim 6, wherein the first and second recesses are provided at the inner lateral sides thereof with a concave-convex pattern.

9. The light emitting device of claim 8, wherein the concave-convex pattern comprises a concave pattern and a convex pattern.

10. The light emitting device package of claim 9, wherein the concave pattern has a shape recessed outward from the convex pattern.

11. The light emitting device package of claim 9, wherein the concave-convex pattern has a V shape or a dent shape.

12. A light emitting device package comprising:
a body having a cavity therein;
first and second recesses inside the cavity in the body;
first and second electrode layers in the first and second recesses;
a light emitting device on the first and second electrode layers;
first and second bumps provided under the light emitting device and fixed into the first and second recesses; and
solder pastes filled in the first and second recesses to fix the first and second electrode layers to the light emitting device,
wherein each of the first and second electrode layers includes an electrode support on an outer surface of the body, and an electrode contact part extending from the electrode support while passing through the body,
wherein the solder pastes surrounds bottom and side of one of the first and second bumps.

13. The light emitting device package of claim 12, wherein the electrode contact part comprises:
a protrusion part protruding upward from the electrode support; and
first and second contact pads branching from the protrusion part.

14. The light emitting device package of claim 13, wherein the first and second contact pads are formed in the first and second recesses, respectively.

15. The light emitting device package of claim 13, wherein upper regions of the first and second contact pads are provided at a portion of a bottom surface of the cavity.

16. The light emitting device package of claim 13, wherein the protrusion part is provided in first and second holes.

17. The light emitting device package of claim 16, wherein the protrusion part has a lateral side surrounded by the body.

18. The light emitting device package of claim 12, wherein inner lateral sides of the first and second recesses are inclined with respect to a bottom surface thereof.

19. The light emitting device package of claim 13, wherein lower regions of the first and second recesses have diameters greater than diameters of upper regions of the first and second recesses.

20. The light emitting device package of claim 2, wherein the first and second electrode layers include Cu, Al, Cr, Pt, Ti, Au and W.

* * * * *